United States Patent
Reddy et al.

(10) Patent No.: US 9,548,670 B2
(45) Date of Patent: Jan. 17, 2017

(54) METHODS AND SYSTEMS FOR CALIBRATING A RESONANT CONVERTER

(71) Applicant: General Electric Company, Schenectady, NY (US)

(72) Inventors: Raghothama Reddy, Plano, TX (US); Darwin Drake Smith, Rowlett, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/189,154

(22) Filed: Feb. 25, 2014

(65) Prior Publication Data

US 2014/0268904 A1 Sep. 18, 2014

Related U.S. Application Data

(60) Provisional application No. 61/793,763, filed on Mar. 15, 2013.

(51) Int. Cl.
*H02M 3/335* (2006.01)
*H02M 3/337* (2006.01)
(Continued)

(52) U.S. Cl.
CPC ........ *H02M 3/337* (2013.01); *G01R 19/16538* (2013.01); *G01R 31/42* (2013.01);
(Continued)

(58) Field of Classification Search
CPC ... G01R 31/02; G01R 31/42; G01R 19/16538; G01R 9/16538; H02M 3/33507; H02M 2001/0058; H02M 2007/4815; H02M 1/4208; H02M 1/4241; H02M 2001/003; H02M 2001/009; H02M 2001/0012; H02M 2001/0016; H02M 2001/0019; H02M 2001/0083; H02M 2001/0093; H02M 201/003; H02M 201/009; H02M 201/0012; H02M 201/0016; H02M 201/0019; H02M 201/0083; H02M 201/0092; H02M 201/0058; H02M 3/335–3/3378; Y02B 70/1491; Y02B 70/1433
(Continued)

(56) References Cited

U.S. PATENT DOCUMENTS 5,570,276 A * 10/1996 Cuk et al. ........................ 363/16
5,900,701 A *  5/1999 Guhilot .................. H05B 41/28
                                                         315/209 R
(Continued)

FOREIGN PATENT DOCUMENTS

WO        03055052 A1    7/2003
WO     WO2011/102910 A1 * 8/2011

OTHER PUBLICATIONS

J. Duncan Glover, Mulukutla S. Sarma, Thomas J. Oberbye, Power System Analysis and Design, 4th Ed. 2008, Thompson Learning Inc. p. 96-99.*

(Continued)

*Primary Examiner* — Jessica Han
*Assistant Examiner* — Lorena Bruner
(74) *Attorney, Agent, or Firm* — General Electric Company

(57) ABSTRACT

Methods and systems for calibrating an inductor-inductor-capacitor (LLC) resonant converter are provided herein. The method includes calculating input voltage mathematically as a function of at least one of an output voltage, a load current, and tolerances of components of the LLC resonant converter and operating the LLC resonant converter in an open loop mode at a nominal resonant frequency. The method also includes measuring output voltage of the LLC resonant
(Continued)

converter and comparing the measured output voltage to the calculated input voltage.

19 Claims, 4 Drawing Sheets

(51) Int. Cl.
    *H02M 1/00*                    (2006.01)
    *G01R 31/42*                  (2006.01)
    *G01R 19/165*                (2006.01)

(52) U.S. Cl.
    CPC .. *H02M 2001/0058* (2013.01); *Y02B 70/1433* (2013.01); *Y02B 70/1491* (2013.01)

(58) Field of Classification Search
    USPC .................. 363/21.06, 126, 16, 97, 282, 39, 315,363/291, 131, 41, 134, 21.02; 323/266, 271, 323/265; 324/500
    See application file for complete search history.

(56) References Cited

U.S. PATENT DOCUMENTS

| | | | |
|---|---|---|---|
| 6,437,994 B1 | 8/2002 | Blom et al. | |
| 8,018,740 B2 * | 9/2011 | Sun | H02M 3/33569 363/131 |
| 8,094,466 B2 | 1/2012 | Duerbaum et al. | |
| 8,259,477 B2 | 9/2012 | Jin et al. | |
| 2004/0095164 A1 | 5/2004 | Kernahan et al. | |
| 2006/0239046 A1 * | 10/2006 | Zane | H02M 3/1584 363/65 |
| 2008/0298093 A1 * | 12/2008 | Jin | H02M 3/285 363/21.06 |
| 2009/0097280 A1 * | 4/2009 | Wu | H02M 3/33592 363/17 |
| 2009/0244934 A1 * | 10/2009 | Wang | H02M 3/33592 363/21.06 |
| 2009/0303753 A1 * | 12/2009 | Fu | H02M 3/33592 363/20 |
| 2009/0306914 A1 | 12/2009 | Cohen | |
| 2009/0323380 A1 | 12/2009 | Harrison | |
| 2010/0328969 A1 * | 12/2010 | Meyer | 363/21.03 |
| 2011/0002145 A1 | 1/2011 | Halberstadt | |
| 2011/0103097 A1 * | 5/2011 | Wang | H02M 3/33592 363/17 |
| 2012/0163039 A1 | 6/2012 | Halberstadt | |
| 2012/0275197 A1 * | 11/2012 | Yan | H02M 3/33592 363/21.02 |

OTHER PUBLICATIONS

"Sliding Mode Design of Distributed Central Limit Control Strategy for Parallel-Connected Inverters" Ramos et al. IEEE, 2002.*
Lee, "Auxiliary Switch Control of Bidirectional Soft-Switching DC/DC Converter", IEEE Transactions on Power Electronics, vol. 28, No. 12, Dec. 2013, pp. 5446-5457.

* cited by examiner

METHODS AND SYSTEMS FOR CALIBRATING A RESONANT CONVERTER

CROSS-REFERENCE TO RELATED APPLICATIONS

This application claims the benefit of U.S. Provisional Patent Application No. 61/793,763 filed Mar. 15, 2013, which is hereby incorporated by reference in its entirety.

BACKGROUND

The field of the invention relates generally to power converters, and more specifically, to methods and systems of calibrating a resonant converter.

Current designs employing inductor-inductor-capacitor (LLC) resonant converter topologies on an output stage use an empirical approach to determine the required input voltage to accommodate all the tolerances in the circuit. For example, tolerances may include a +/−5% to 8% variation in resonant inductor value, and/or a +/−5% variation in capacitor value. This approach does not achieve high efficiency at all load conditions and all output voltages because the empirical approach uses worst case conditions. Known approaches use a look-up table or close-a-loop on the resonant frequency.

BRIEF DESCRIPTION

In one embodiment, a method of calibrating a resonant converter is provided. The method includes calculating input voltage mathematically as a function of at least one of an output voltage, a load current, and tolerances of components of the LLC converter and operating the LLC converter in an open loop mode at a nominal resonant frequency. The method also includes measuring output voltage of the LLC converter and comparing the measured output voltage to the calculated input voltage.

In another embodiment, an inductor-inductor-capacitor (LLC) resonant converter is provided. The converter includes an inverter, a resonant tank, and a controller coupled to the inverter and to the resonant tank. The controller is configured to calculate input voltage mathematically as a function of at least one of an output voltage, a load current, and tolerances of components of the LLC converter and operate the LLC converter in an open loop mode at a nominal resonant frequency. The controller is also configured to measure output voltage of the LLC converter and compare the measured output voltage to the calculated voltage.

DETAILED DESCRIPTION

Figure 1:
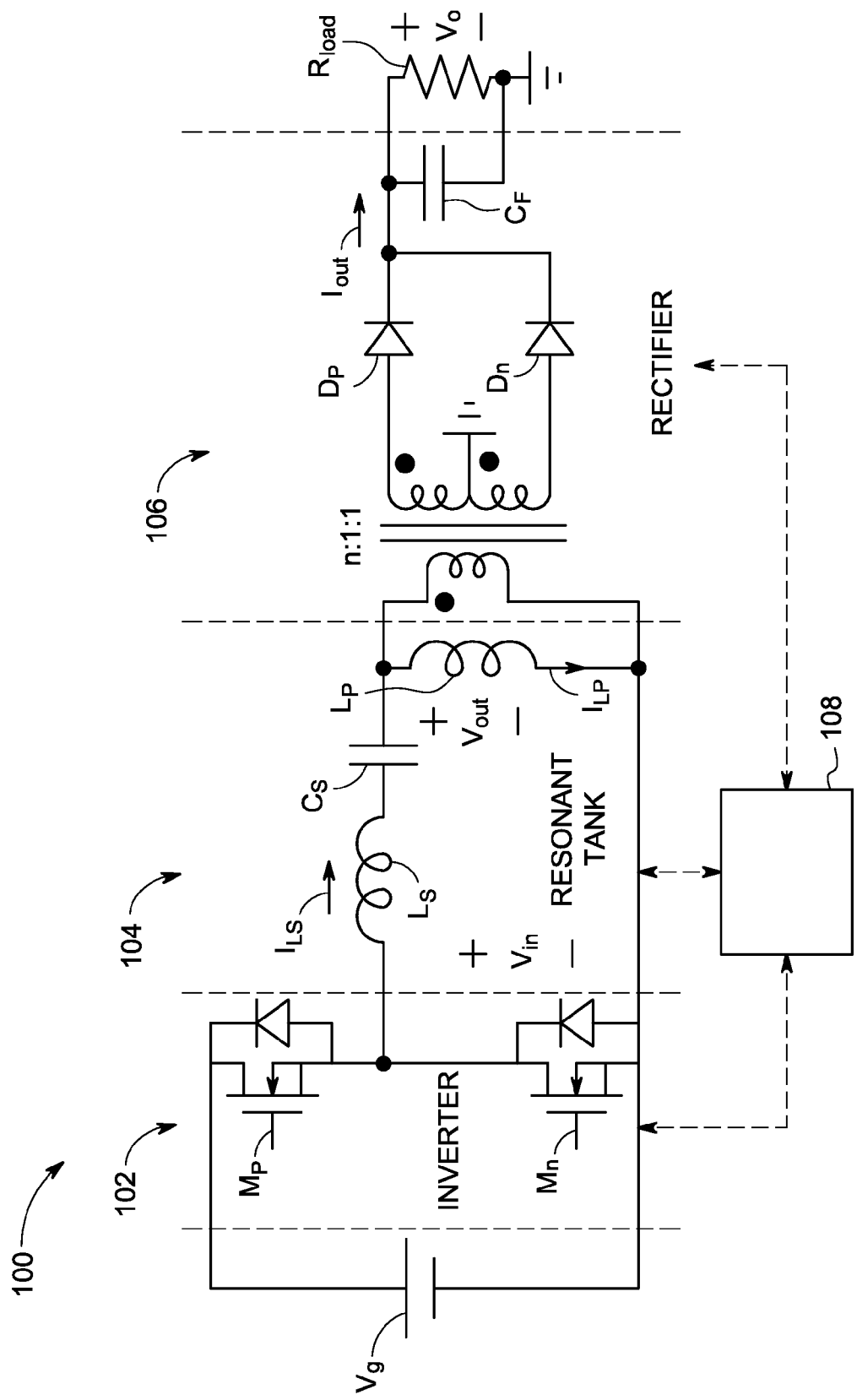
FIG. 1 is a circuit diagram of a conventional LLC series resonant converter.

FIG. 1 is a circuit diagram of an inductor-inductor-capacitor (LLC) series resonant converter 100 for converting an input voltage $V_g$ to a different voltage $V_o$ at its output. In an exemplary embodiment, converter 100 includes an inverter 102, an LLC series resonant tank 104, and a rectifier 106. Inverter 102 is a half-bridge inverter and includes a first switch ($M_p$) 110 and a second switch ($M_n$) 112. Switches 110 and 112 are complementary driven to generate a square wave at an input $V_{in}$ of resonant tank 104. Resonant tank 104 includes an inductor ($L_s$) 114, a series capacitor ($C_s$) 116, and a resonant inductor ($L_p$) 118 coupled in series to realize resonance. Resonant inductor 118 is coupled in parallel with a load.

In an exemplary embodiment, rectifier 106 includes a center-tapped transformer 120, a filter capacitor ($C_F$) 122, a first rectifier diode ($D_P$) 124 and a second rectifier diode ($D_N$) 126. Rectifier 106 rectifies the AC waveform from resonant tank 104 into a DC output. Rectifier 106 may be either a half-bridge rectifier, a full-bridge rectifier, or any other type of rectifier that enables rectifier 106 to function as described herein. In low-output voltage, high-current applications, first and second rectifier diodes 124 and 126 are replaced with synchronized rectifiers (not shown) to reduce the voltage drop (conduction losses) across each semiconductor rectifier.

In an exemplary embodiment, LLC converter 100 also includes a controller 108 communicatively coupled to inverter 102, resonant tank 104, and/or rectifier 106. Controller 108 is configured to perform one or more operations of converter 100, as described in more detail herein. For example, controller 108 uses mathematics to calculate an optimal bus voltage as a function of output voltage, load current, input frequency, and/or tolerances in elements of LLC tank 104, namely resonant inductor 118 and resonant capacitor 116. This facilitates operation of each element at peak efficiency without degrading other performances, such as psophometric noise. The mathematics are given by:

$$V_{bus} = V_{out} \times N_t \times M + I_{out} \times f \times y \pm x \qquad (1)$$

'Vout' is an output voltage of LLC converter 100. 'Nt' is a turns ratio of transformer 120. 'M' is a multiplier, and applies a value of two for a half-bridge rectifier and a value of one for a full-bridge rectifier. 'Iout' is real-time output current of LLC converter 100. 'f' is the input frequency, 'y' is the coefficient representing ripple across a 400V bus, and 'x' is the calibration factor that can be obtained during testing.

In an exemplary embodiment, calibration is accomplished by operating LLC converter 100 in an open loop mode at a nominal resonant frequency. Operating LLC converter 100 in an open loop mode may also be accomplished by operating LLC converter 100 at a pre-defined load or at a pre-defined input voltage. During this test, output voltage $V_o$ is measured and compared to the desired nominal value. If the measured output voltage $V_o$ is lower than the expected value, it can be inferred that particular tank has lower resonant frequency and hence, the coefficient x will have a $-v_e$ sign and the magnitude is a function of the difference between measured versus expected value. Alternatively, if the measured voltage is higher than expected, it implies that the resonant frequency of that unit is higher than nominal and the coefficient x will have a $+v_e$ sign. The magnitude is a function of the difference between measured versus expected value.

Figure 2:
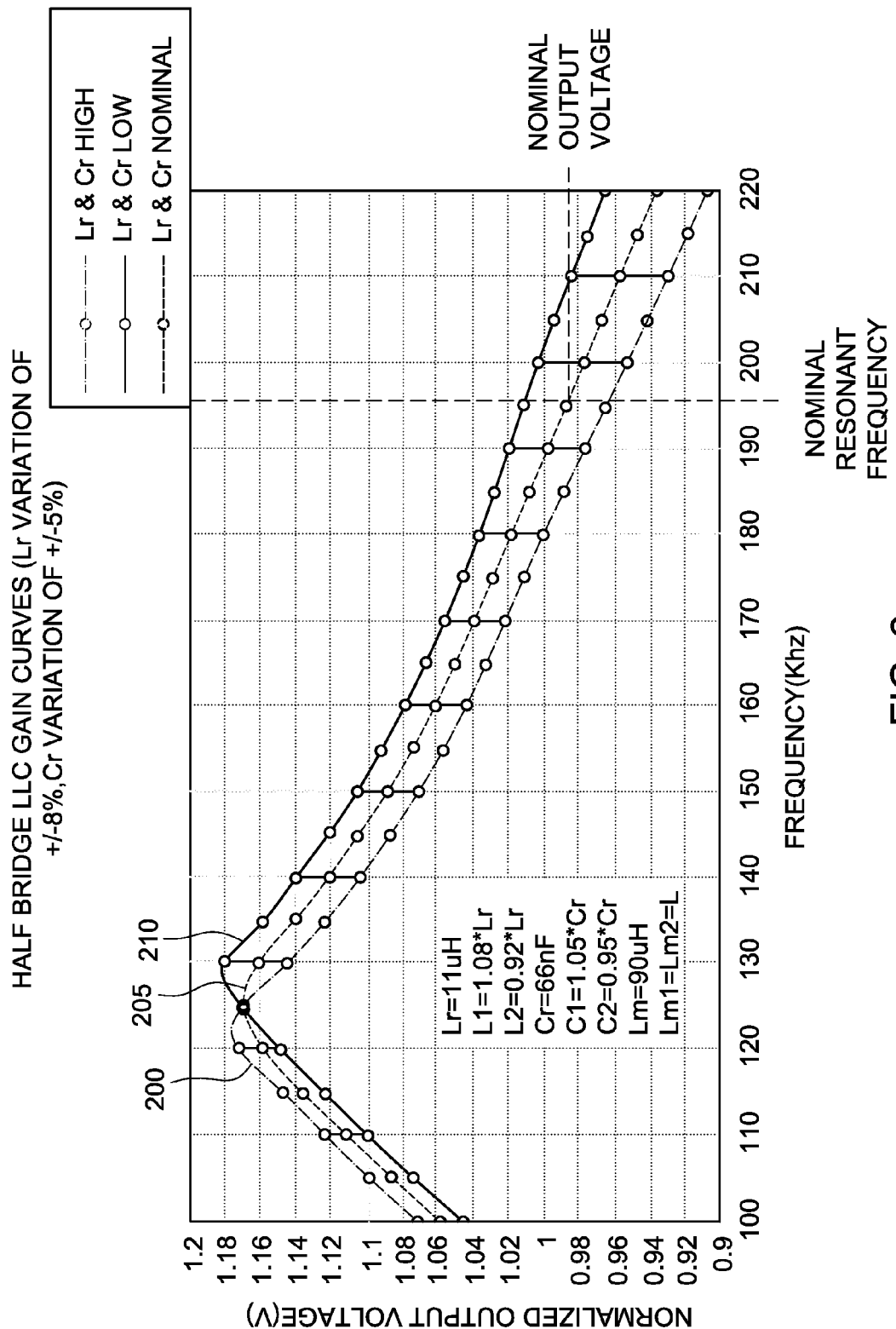
FIG. 2 is a graph showing gain curves for the LLC power converter shown in FIG. 1.

FIG. 2 is a graph showing gain curves for LLC power converter 100 (shown in FIG. 1). The gain curves correspond to normalized DC output voltages of LLC power converter 100 and include a first normalized gain curve 200, a second normalized gain curve 205, and a third normalized gain curve 210. In the exemplary embodiment, the resonant inductor has a variation of +/−8% and the resonant capacitor has a variation of +/−5%. As shown in FIG. 2, nominal resonant frequency is about 186 kHz and nominal output voltage is between 1V and 1.02V.

Figure 3:
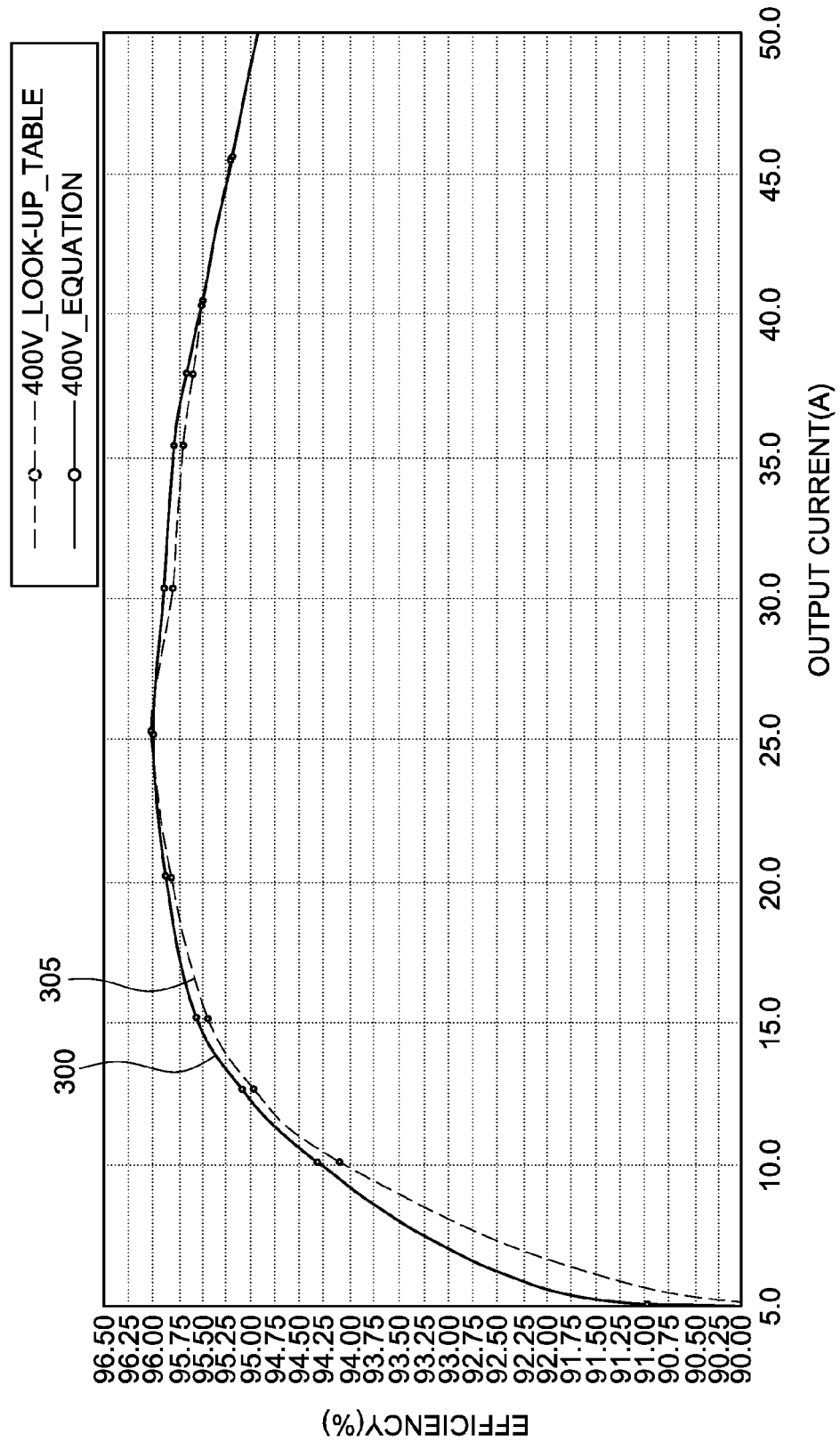
FIG. 3 is a graph showing efficiency comparisons between a look-up table and an exemplary equation applied to a rectifier having tank values that are near nominal

FIG. 3 is a graph showing efficiency comparisons between systems using a look-up table and using equation (1) described above applied to a rectifier having tank values that are near nominal. A first curve 300 is associated with the efficiency of an LLC converter using equation (1) to determine voltage. A second curve 305 is associated with a system using the look-up table to determine voltage. In the exemplary embodiment, equation (1) is applied to a rectifier having tank values that are near nominal. As shown in FIG. 3, curve 300 representing equation (1) achieves a higher efficiency throughout nearly the entire operating range than does curve 305 using a look-up table.

Figure 4:
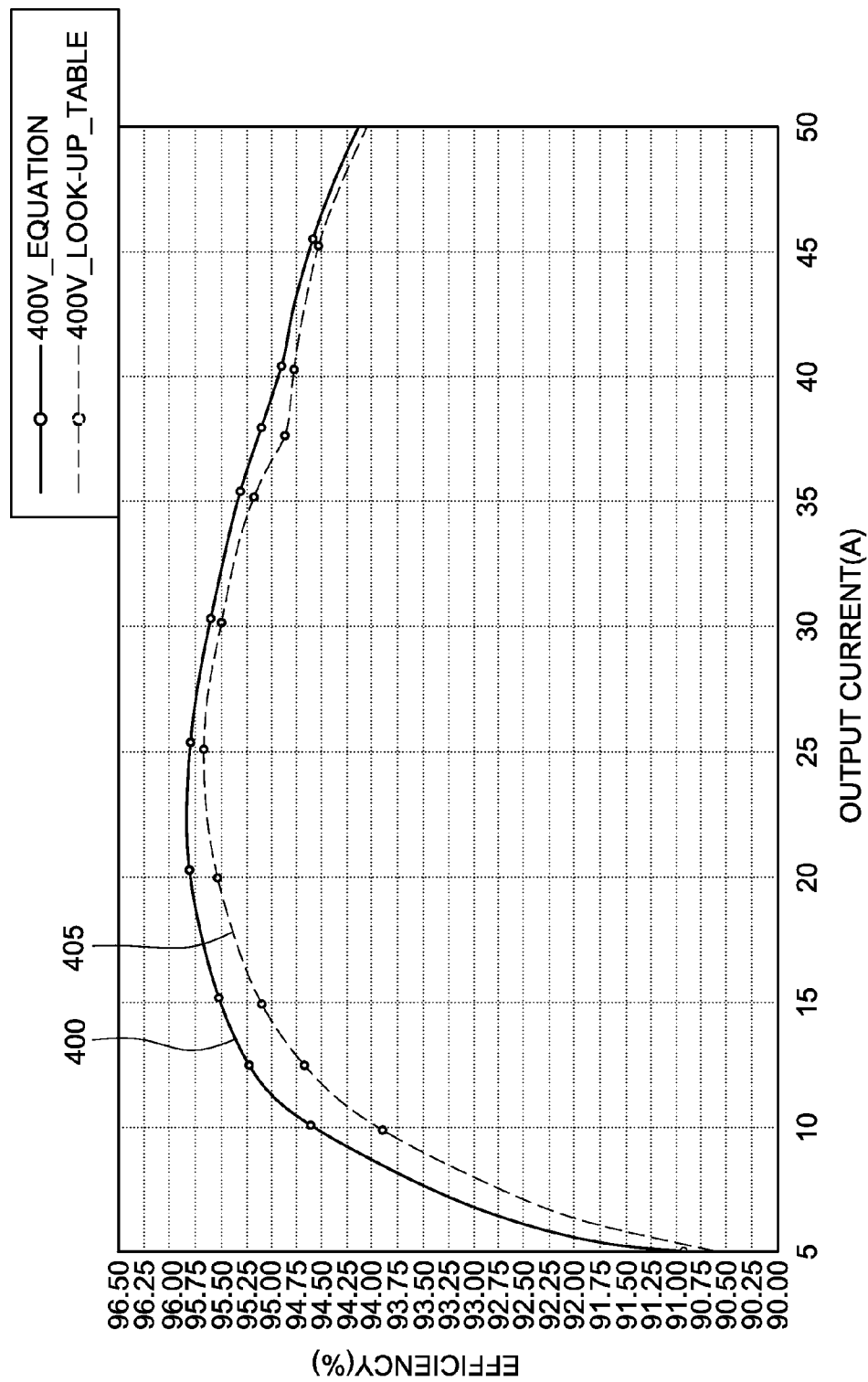
FIG. 4 is a graph showing efficiency comparisons between a look-up table and an exemplary equation applied to a rectifier having tank elements on a low end of the tolerance range.

FIG. 4 is a graph showing efficiency comparisons between a look-up table and equation (1) of a rectifier having tank elements on a low end of the tolerance range. A first curve 400 is associated with the efficiency of an LLC converter using equation (1) to determine voltage. A second curve 405 is associated with a system using the look-up table to determine voltage. As shown in FIG. 4, curve 400 representing equation (1) achieves a higher efficiency throughout substantially all of the entire operating range than does curve 405 using a look-up table.

The embodiments described herein provide a controller that implements a mathematical method of calculating optimal bus voltage as a function of output voltage, load current, input frequency, and tolerances in LLC tank elements, namely a resonant inductor and a resonant capacitor. The embodiments enable each element to operate at peak efficiency without degrading other performances like psophometric noise. Moreover, the embodiments provide a procedure to obtain a coefficient for compensating tolerances in an LLC resonant converter without measuring tank frequency.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

As used herein, the term controller may refer to an electronic controller, which may include a computer processor or processing device (not shown). The processor is generally any piece of hardware that is capable of processing information such as, for example, data, computer-readable program code, instructions or the like (generally "computer programs," e.g., software, firmware, etc.), and/or other suitable electronic information. For example, the processor may be configured to execute computer programs or commands, which may be stored onboard the processor or otherwise stored in an associated memory (not shown). In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program. As used herein, electronic or computer memory is generally any piece of hardware that is capable of storing information such as data, computer programs and/or other suitable information either on a temporary basis or a permanent basis. In one example, the memory may be configured to store various information in one or more databases. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk read-only-memory (CD-ROM), compact disk read/write memory (CD-R/W), digital video disk memory (DVD), or the like. In various instances, the memory may be referred to as a computer-readable storage medium which, as a non-transitory device capable of storing information, may be distinguishable from computer-readable transmission media such as electronic transitory signals capable of carrying information from one location to another. Computer-readable media, as described herein, may generally refer to a computer-readable storage medium or computer-readable transmission medium.

What is claimed is:

1. A method of calibrating an inductor-inductor-capacitor (LLC) resonant converter, said method comprising:
   operating, by a controller coupled to the LLC resonant converter, the LLC resonant converter in an open loop mode at a nominal resonant frequency and a predetermined input voltage during a calibration of the LLC resonant converter;
   measuring, by the controller, an open loop output voltage of the LLC resonant converter when operated at the nominal resonant frequency and the predetermined input voltage;
   comparing, by the controller, the measured open loop output voltage to a nominal output voltage stored in the controller to determine a polarity of a calibration factor of the LLC resonant converter;
   calculating, by the controller, an optimum input voltage for the LLC resonant converter as a function of the measured open loop output voltage, the calibration factor, a load current, and predefined operating tolerances that include a variation range of a resonant inductor and a resonant capacitor of the LLC resonant converter; and
   operating, by the controller, the LLC resonant converter in a normal operation mode at the calculated optimum input voltage to improve efficiency of the LLC resonant converter at all load conditions while accommodating the predefined operating tolerances of the resonant inductor and the resonant capacitor.

2. The method according to claim 1, wherein operating the LLC resonant converter in an open loop mode comprises operating at a pre-defined load.

3. The method according to claim 1, wherein operating the LLC resonant converter in an open loop mode comprises operating at a pre-defined input voltage.

4. The method according to claim 1, wherein calculating input voltage mathematically comprises calculating input voltage according to: $V_{bus} = V_{out} \times N_t \times M + I_{out} \times f \times y \pm x$, wherein $V_{out}$ is an output voltage of the LLC resonant converter, $N_t$ is a turns ratio of a transformer, M is a multiplier, $I_{out}$ is real-time output current of the LLC resonant converter, f is an input frequency, y is a coefficient representing ripple across a 400V bus, and x is a calibration factor that can be obtained during testing.

5. The method according to claim 4, wherein the LLC resonant converter includes a half-bridge rectifier, said method further comprises calculating input voltage using a value of two for the multiplier M.

6. The method according to claim 4, wherein the LLC resonant converter includes a full-bridge rectifier, said method further comprises calculating input voltage using a value of one for the multiplier M.

7. The method according to claim 4, wherein when the measured output voltage is lower than the calculated input voltage, said method comprises applying, by the controller, a negative value to the calibration factor x.

8. The method according to claim 7, further comprising determining a magnitude of the voltage as a function of a difference between the measured and the calculated input voltages.

9. The method according to claim 4, wherein when the measured output voltage is higher than the calculated input voltage, said method further comprises applying, by the controller, a positive value to the calibration factor x.

10. The method according to claim 9, further comprising determining a magnitude of the voltage as a function of a difference between the measured and the calculated input voltages.

11. An inductor-inductor-capacitor (LLC) resonant converter comprising:
an inverter;
a resonant tank; and
a controller coupled to said inverter and to said resonant tank, said controller configured to:
operate the LLC resonant converter in an open loop mode at a nominal resonant frequency and a predetermined input voltage during a calibration of the LLC resonant converter;
measure an open loop output voltage of the LLC resonant converter when operated at the nominal resonant frequency and the predetermined input voltage;
compare the measured open loop output voltage to a nominal output voltage stored in the controller to determine a polarity of a calibration factor of the LLC resonant converter;
calculate an optimum input voltage for the LLC resonant converter as a function of the measured open loop output voltage, the calibration factor, a load current, and predefined operating tolerances that include a variation range of a resonant inductor and a resonant capacitor of the LLC resonant converter; and
operate the LLC resonant converter in a normal operation mode at the calculated optimum input voltage to improve efficiency of the LLC resonant converter at all load conditions while accommodating the pre-defined operating tolerances of the resonant inductor and the resonant capacitor.

12. The LLC resonant converter according to claim 11, wherein said controller is further configured to operate with at least one of a pre-defined load and a pre-defined voltage.

13. The LLC resonant converter according to claim 11, wherein to calculate input voltage mathematically, said controller is further configured to calculate input voltage according to: $V_{bus} = V_{out} \times N_t \times M + I_{out} \times f \times y \pm x$.

14. The LLC resonant converter according to claim 13, wherein Vout is an output voltage of the LLC resonant converter, Nt is a turns ratio of a transformer, M is a multiplier, Iout is real-time output current of the LLC resonant converter, f is an input frequency, y is a coefficient representing ripple across a 400V bus, and x is a calibration factor that can be obtained during testing.

15. The LLC resonant converter according to claim 13, further comprising a half-bridge rectifier, said controller is further configured to apply a value of two to M.

16. The LLC resonant converter according to claim 13, further comprising a full-bridge rectifier, said controller is further configured to apply a value of one to M.

17. The LLC resonant converter according to claim 13, wherein when the measured output voltage is lower than the calculated voltage, said controller is configured to apply a negative value to the calibration factor x.

18. The LLC resonant converter according to claim 13, wherein when the measured output voltage is higher than the calculated voltage, said controller is configured to apply a positive value to the calibration factor x.

19. The LLC resonant converter according to claim 11, wherein said resonant tank comprises a resonant inductor and a resonant capacitor.

* * * * *